(12) United States Patent
Katyal (10) Patent No.: US 8,854,095 B2
(45) Date of Patent: Oct. 7, 2014

(54) FAST LOCK ACQUISITION AND DETECTION CIRCUIT FOR PHASE-LOCKED LOOPS

(71) Applicant: STMicroelectronics International N. V., Amsterdam (NL)

(72) Inventor: Amit Katyal, Ghaziabad (IN)

(73) Assignee: STMicroelectronics International N.V., Amsterdam (NL)

( * ) Notice: Subject to any disclaimer, the term of this patent is extended or adjusted under 35 U.S.C. 154(b) by 4 days.

(21) Appl. No.: 13/674,394

(22) Filed: Nov. 12, 2012

(65) Prior Publication Data

US 2014/0132308 A1    May 15, 2014

(51) Int. Cl.
*H03L 7/06* (2006.01)
*H03L 7/08* (2006.01)
*H03B 19/00* (2006.01)

(52) U.S. Cl.
CPC . *H03L 7/08* (2013.01); *H03B 19/00* (2013.01)
USPC .......................................................... 327/156

(58) Field of Classification Search
USPC .................................. 327/156, 157; 375/376
See application file for complete search history.

(56) References Cited

U.S. PATENT DOCUMENTS

| 6,593,817 | B1 | 7/2003 | Magazz' et al. | |
|---|---|---|---|---|
| 6,703,877 | B2* | 3/2004 | Kobayashi et al. | 327/156 |
| 6,940,356 | B2 | 9/2005 | McDonald, II et al. | |
| 2003/0090305 | A1* | 5/2003 | Kobayashi et al. | 327/156 |
| 2008/0036543 | A1* | 2/2008 | Bazes | 331/8 |
| 2011/0221489 | A1* | 9/2011 | Tarng et al. | 327/156 |
| 2012/0086483 | A1* | 4/2012 | Suzuki | 327/156 |
| 2013/0187689 | A1* | 7/2013 | Choi | 327/157 |

* cited by examiner

*Primary Examiner* — Ryan Jager
(74) *Attorney, Agent, or Firm* — Gardere Wynne Sewell LLP (57) ABSTRACT

A phase lock loop (PLL) circuit incorporates switched capacitive circuitry and feedback circuitry to reduce the time to achieve a lock condition. During a first mode, the frequency of a voltage controlled oscillator (VCO) is used to adjust the control voltage of the VCO to achieve a coarse lock condition. During a second mode, a reference frequency is used to control a charge pump to more precisely adjust the control voltage to achieve fine lock of the PLL. Because the VCO frequency is significantly higher than the reference frequency, the control voltage is varied at a greater rate during the first mode. In some embodiments, the time to achieve lock may be further reduced by initializing the VCO control voltage to a particular voltage so as to reduce the difference between the control voltage at start-up and the control voltage at the beginning of the first mode during coarse lock.

36 Claims, 8 Drawing Sheets

FAST LOCK ACQUISITION AND DETECTION CIRCUIT FOR PHASE-LOCKED LOOPS

FIELD OF THE INVENTION

This invention generally relates to Phase-Locked Loops (PLLs) and, more particularly, to a circuit and method for reducing the locking time of a PLL and detection of phase lock.

BACKGROUND

Conventional Phase-Locked Loops, also known as Phase Lock Loops, achieve phase lock in part by pumping a limited charge current through a feedback loop to appropriately charge and/or discharge a low-pass filter capacitor. The voltage across the capacitor drives a voltage-controlled oscillator (VCO) to generate a periodic output signal. A divided version of the periodic output signal is evaluated to determine if it is in phase with a reference frequency signal that is used to control the activation/deactivation of the charge current pump. Because the reference frequency signal is used to control the charging of the capacitor driving the VCO, the frequency of the reference frequency signal (i.e., the reference frequency) affects the time to achieve phase lock between the output signal and the reference frequency signal. For higher reference frequencies, the activation/deactivation of the charge current pump occurs more rapidly and the time to achieve phase lock between the two signals is shorter. Conversely, for lower reference frequencies, the activation/deactivation of the charge current pump occurs less frequently and the time to achieve phase lock is greater. In some instances, the amount of time to achieve phase lock can be undesirable, particularly when the reference frequency is low and the phase of the divided version of the output signal is substantially offset from the phase of the reference frequency signal.

SUMMARY

The present disclosure provides an integrated circuit and method for reducing the locking time of a PLL and for detecting phase lock achieved by the PLL. In one embodiment, the phase lock loop circuit comprises: a voltage controlled oscillator configured to generate an output frequency signal; a frequency divider configured to divide the output frequency signal and generate a feedback frequency signal; a first circuit configured to adjust a control voltage of the voltage controlled oscillator at a rate set by a reference frequency signal; a second circuit configured to adjust the control voltage of the voltage controlled oscillator at a rate set by the output frequency signal; a lock circuit configured to detect a frequency lock condition; and a switching circuit configured to couple the first circuit to the voltage controlled oscillator when the frequency lock condition is detected by the lock circuit and couple the second circuit to the voltage controlled oscillator when the frequency lock condition is not detected by the lock circuit.

Another embodiment provides a phase lock loop circuit comprising: a voltage controlled oscillator circuit operable to receive a control voltage and generate an output frequency signal responsive to the control voltage; a switched capacitive circuit operable to receive the output frequency signal and to produce a first signal indicative of the output frequency signal; a first charge control circuit operable to compare the first signal to a reference signal, and to produce a first current for adjusting the control voltage to achieve a first lock condition; a second charge control circuit operable to generate a second current for adjusting the control voltage to achieve a second lock condition; and control circuitry operable to couple the first charge control circuit to the voltage controlled oscillator circuit until the first lock condition is achieved, and operable, after the first lock condition is achieved, to couple the second charge control circuit to the voltage controlled oscillator circuit until the second lock condition is achieved.

Yet another embodiment provides a method for achieving a lock condition in a phase lock loop circuit, the method comprising: coupling feedback circuitry to an oscillator circuit; providing a control voltage for controlling the oscillator circuit at a first frequency; producing, via a switched capacitive circuit, a lock signal indicative of the first frequency; generating, in response to the lock signal, a first current for adjusting the control voltage at a rate set by the first frequency to achieve a first lock condition; detecting the first lock condition; coupling current-generating circuitry to the oscillator circuit; and generating, via the current-generating circuitry, a second current for adjusting the control voltage at a rate set by a reference frequency signal to achieve a second lock condition.

Another embodiment provides a method for achieving a lock condition in a phase lock loop circuit, the method comprising: providing a control voltage for controlling a voltage controlled oscillator circuit to generate an output frequency signal; detecting a frequency lock condition; modulating the control voltage as a function of a reference frequency signal when the frequency lock condition is detected; and modulating the control voltage as a function of the output frequency signal when the frequency lock condition is not detected.

The foregoing and other features and advantages of the present disclosure will become further apparent from the following detailed description of the embodiments, read in conjunction with the accompanying drawings. The detailed description and drawings are merely illustrative of the disclosure, rather than limiting the scope of the invention as defined by the appended claims and equivalents thereof.

BRIEF DESCRIPTION OF DRAWINGS

Embodiments are illustrated by way of example in the accompanying figures not necessarily drawn to scale, in which like numbers indicate similar parts, and in which.

DETAILED DESCRIPTION OF THE EMBODIMENTS

Figure 1A:
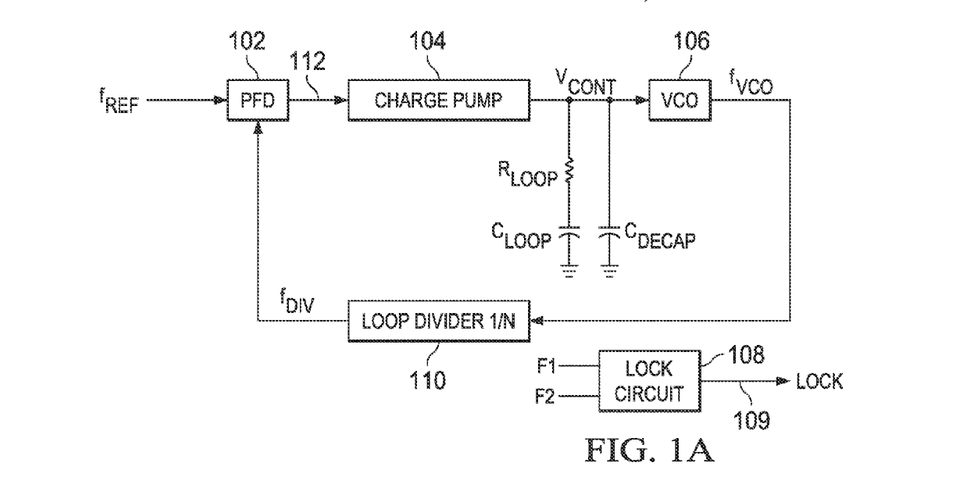
FIG. 1A illustrates an example embodiment of a PLL circuit.

FIG. 1A illustrates an example embodiment of a PLL circuit 100. The circuit 100 includes a phase-frequency detector (PFD) 102, charge pump 104, voltage-controlled oscillator (VCO) 106, lock detection circuit 108, frequency divider 110, and low-pass filter components: resistor $R_{LOOP}$, capacitor $C_{LOOP}$, and decoupling capacitor $C_{DECAP}$. When the PLL circuit 100 is phase locked with an input reference frequency signal $f_{REF}$, a frequency $f_{VCO}$ of the VCO 106 is equal to that of the input signal $f_{REF}$ multiplied by a division ratio N of the frequency divider 110 (i.e., $f_{DIV}=f_{VCO}/N$).

The PFD 102 receives the input reference frequency signal $f_{REF}$ and a frequency-divided signal $f_{DIV}$ output from the frequency divider 110, and produces an error signal 112 proportional to the phase difference between the two signals. It should be appreciated that, in some embodiments, the PFD circuit 102 may also include level-shifting circuitry for shifting the voltage level of $f_{DIV}$, $f_{REF}$, or both. The error signal 112 is used to control operation of the charge pump 104 to sink or source current into or out of the decoupling capacitor $C_{DECAP}$ to produce a voltage $V_{CONT}$ for controlling the VCO 106, and consequently its frequency $f_{VCO}$, thereby driving the feedback frequency $f_{DIV}$ output from the frequency divider 110 to the same value as the input frequency $f_{REF}$.

When there exists a phase difference between the input frequency $f_{REF}$ and the feedback frequency $f_{DIV}$, the control voltage $V_{CONT}$ is adjusted so that the VCO frequency $f_{VCO}$ is increased or decreased in response to changes in the control voltage $V_{CONT}$. To adjust the phase of the frequency-divided signal $f_{DIV}$ in a first direction, the charge pump 104 sources current into $C_{DECAP}$ to increase $V_{CONT}$, thereby increasing $f_{VCO}$ and adjusting the phase of $f_{DIV}$. To adjust the phase of the frequency-divided signal $f_{DIV}$ in a second, opposite direction, the charge pump 104 sinks current from $C_{DECAP}$ to decrease $V_{CONT}$, thereby decreasing $f_{VCO}$ and adjusting the phase of $f_{DIV}$.

The PLL circuit also includes a lock detection circuit 108 generally comprised, in some embodiments, of digital circuitry including counters and flip-flops. The lock detection circuit 108 compares the frequencies of two input signals F1 and F2 and, responsive to the comparison, outputs a lock detection signal 109 having a logic high or low value. When the input signals F1 and F2 have a satisfactorily similar frequency, the lock detection signal 109 goes high to indicate lock detection. For example, in an embodiment in which F1 is $f_{REF}$ and F2 is $f_{DIV}$, the lock circuit 108 calculates the number of $f_{DIV}$ cycles that occur during a fixed number of $f_{REF}$ cycles to determine how similar the signals are with respect to each other. If the lock detection circuit 108 is configured to detect a lock condition when the input signals F1 and F2 have a 1% variance in frequency, then the lock detection signal 109 goes high when 99 cycles of $f_{DIV}$ are counted during 100 cycles of $f_{REF}$. It should be appreciated that the input signals F1 and F2 may be other frequency signals that are used to detect a lock condition of the PLL 100. For example, in some embodiments, input F1 may be a multiplied value of the reference frequency signal $f_{REF}$, and input F2 may be the VCO frequency $f_{VCO}$.

Figure 1B:
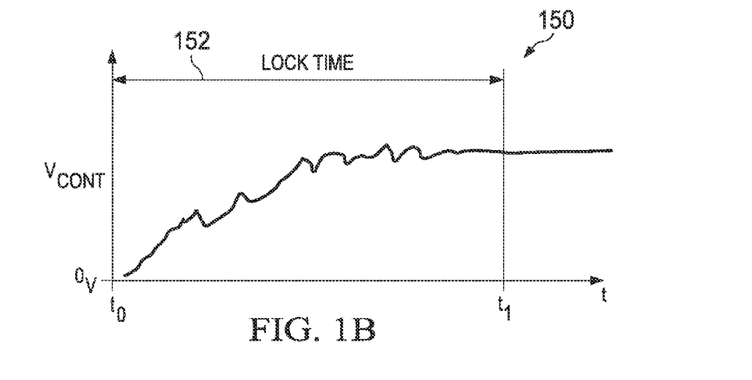
FIG. 1B illustrates a graph illustrating an approximation of the time it takes for the circuit of FIG. 1A to achieve phase lock.

FIG. 1B illustrates an example graph 150 illustrating the time 152 to achieve frequency/phase lock for an example embodiment of the circuit 100 illustrated in FIG. 1A. In the embodiment illustrated in FIG. 1B, the VCO control voltage $V_{CONT}$ is initialized (at $t_0$) to 0V, and increases until lock is achieved (at $t_1$). Once lock is achieved, $V_{CONT}$ is more or less stable and the VCO frequency $f_{VCO}$ is substantially equal to $N*f_{REF}$.

The error signal 112 used to control the charge pump 104 is dependent upon an evaluation of the input reference signal $f_{REF}$ and the frequency-divided signal $f_{DIV}$. Thus, the frequency of the input reference frequency signal $f_{REF}$ affects the time to achieve frequency/phase lock between the frequency-divided signal $f_{DIV}$ and the reference signal $f_{REF}$. When the reference frequency $f_{REF}$ is higher, the activation/deactivation of the charge current pump 104 occurs more rapidly and the time to achieve lock is shorter. Conversely, when the reference frequency $f_{REF}$ is lower, the activation/deactivation of the charge current pump 104 occurs less frequently and the time to achieve lock is greater. When the reference frequency signal $f_{REF}$ is substantially low, the amount of time to achieve frequency/phase lock can be undesirable, particularly when the frequency/phase of the frequency-divided signal $f_{DIV}$ is substantially offset from the frequency/phase of the reference frequency signal $f_{REF}$.

It is an objective of the present disclosure to reduce the time to achieve lock in a PLL circuit. One way of doing this is to drastically control the VCO control voltage $V_{CONT}$ during a first mode to achieve a coarse lock condition, then to more precisely control $V_{CONT}$ during a second mode to achieve fine lock of the PLL circuit. During the first mode, the VCO frequency $f_{VCO}$ is used to control the variation of the VCO control voltage $V_{CONT}$ until coarse lock is achieved. The VCO frequency $f_{VCO}$ is significantly higher than the reference frequency $f_{REF}$; therefore, $V_{CONT}$ can be varied at a greater rate by using the VCO frequency $f_{VCO}$ to control the variation of $V_{CONT}$. During the second mode, the reference frequency $f_{REF}$ is used to control the charge pump to adjust the VCO control voltage $V_{CONT}$ until fine lock is achieved. In some embodiments, the time to achieve lock may be further reduced by also initializing the VCO control voltage $V_{CONT}$ to a particular voltage so as to reduce the difference between $V_{CONT}$ at start-up and $V_{CONT}$ at the beginning of the first mode during coarse lock. It should be appreciated that when $V_{CONT}$ is initialized to a large value, the VCO frequency $f_{VCO}$ is also large, and the control voltage $V_{CONT}$ is subsequently modulated at a greater rate to more rapidly achieve the coarse lock condition.

Figure 2A:
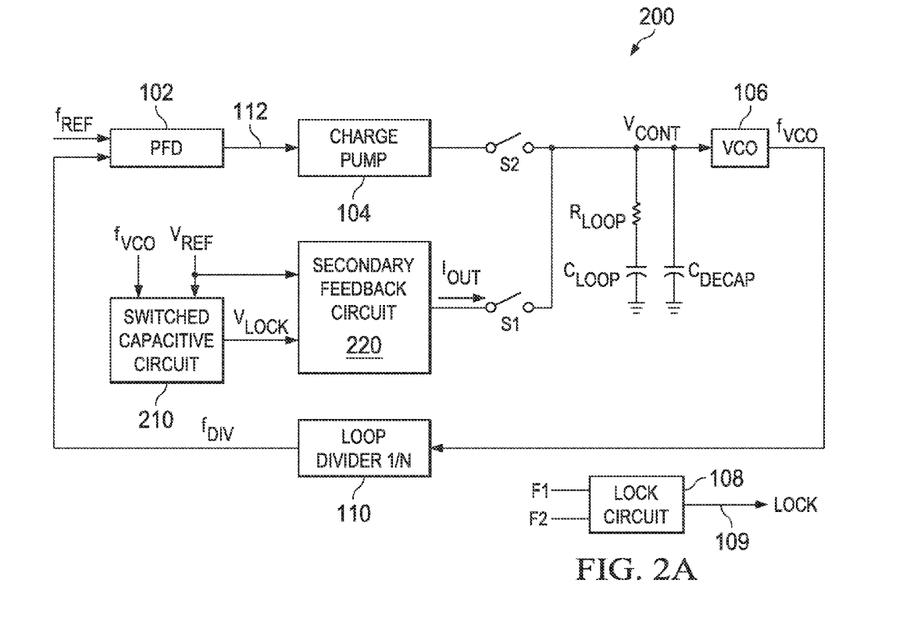
FIG. 2A illustrates an example embodiment of a PLL circuit modified to incorporate a switched capacitive circuit and secondary feedback circuit to reduce the time to achieve phase lock.

FIG. 2A illustrates an embodiment wherein the PLL circuit of FIG. 1A is modified to reduce the time to achieve lock. To do this, the modified circuit 200 incorporates a switched capacitive circuit 210 (also referred to herein as a frequency-to-voltage converter circuit) in combination with a secondary feedback circuit 220 (also referred to herein as a charge control circuit). The additional circuitry (switched capacitive circuit 210 and secondary feedback circuit 220) is selectively coupled to the filtering components ($R_{LOOP}$, $C_{LOOP}$, and $C_{DECAP}$) using a first switch S1, and the charge pump 104 is selectively coupled to the filtering components using a second switch S2 that operates opposite the first switch S1. During the first mode (also referred to herein as the coarse locking mode), switch S1 is closed and switch S2 is open so that the switched capacitive circuit 210 and secondary feedback circuit 220 are connected to the filtering circuitry, and the charge pump 104 is disconnected. During this coarse locking mode, the switched capacitive circuit 210 obtains on-the-fly measurements of $f_{VCO}$, and the secondary feedback circuit 220 produces an output current $I_{OUT}$ (representative of a sinking or sourcing current) to adjust $V_{CONT}$ in accordance with the on-the-fly measurements of $f_{VCO}$ until $V_{CONT}$ is equal to a desired voltage representative of the coarse lock condition wherein $f_{VCO}(\text{steady})=1/(R_{LOCK}*C_{LOCK})$.

Once the steady state of $f_{VCO}$ is achieved, coarse lock is detected by the lock detection circuit 108, and the lock signal 109 is used to control the opening of the first switch S1 to disconnect the switched capacitive circuit 210 and secondary feedback circuit 220, and to control the closing of the second switch S2 to connect the charge pump 104 to the VCO 106 for operation in the second mode (also referred to herein as the fine locking mode). At this point, the reference frequency signal $f_{REF}$ is used to control the charge pump 104, as explained in greater detail above, to adjust the VCO control voltage $V_{CONT}$ until fine lock is achieved.

Figure 2B:
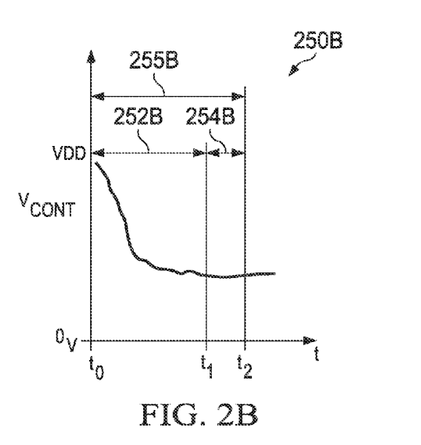
FIGS. 2B and 2C illustrate graphs illustrating an approximation of the time it takes for embodiments of the circuit of FIG. 2A to achieve phase lock.
Figure 2C:
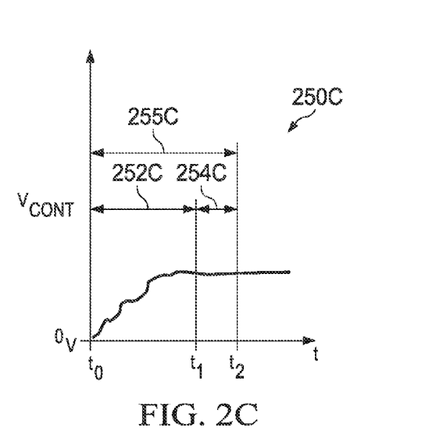

In some embodiments, the VCO control voltage $V_{CONT}$ is initialized to a voltage greater than zero (e.g., VDD). In other embodiments, the circuit illustrated in FIG. 2A may be modified such that $V_{CONT}$ is initialized to 0 V and VCO 106 is active at the 0V initialization value. FIGS. 2B and 2C illustrate example graphs 250B/C illustrating the total time 255B/C to achieve lock for example embodiments of the modified circuit 200 described above with respect to FIG. 2A. In accordance with the foregoing, the graph 250B in FIG. 2B illustrates an embodiment in which the coarse lock time 252B is determined by the time it takes for $V_{CONT}$ to decrease from its initialized value (e.g., VDD) (at $t_0$) to the value at which $f_{VCO}$ is steady (at $t_1$), and fine lock time 254B is determined by the time it takes for $V_{CONT}$ to reach the value at which fine lock is achieved (at $t_2$). The graph 250C in FIG. 2C illustrates an alternate embodiment in which the coarse lock time 252C is determined by the time it takes for $V_{CONT}$ to increase from its 0V initialization value (at $t_0$) to the value in which $f_{VCO}$ is steady (at $t_1$), and fine lock time 254C is determined by the time it takes for $V_{CONT}$ to reach the value at which fine lock is achieved (at $t_2$). In the graphs 250B/C illustrated in FIGS. 2B and 2C, the coarse lock time 252B/C is independent of $f_{REF}$ and, instead, is determined using $f_{VCO}$, whereas the fine lock time 254B/C is determined using $f_{REF}$.

Figure 3:
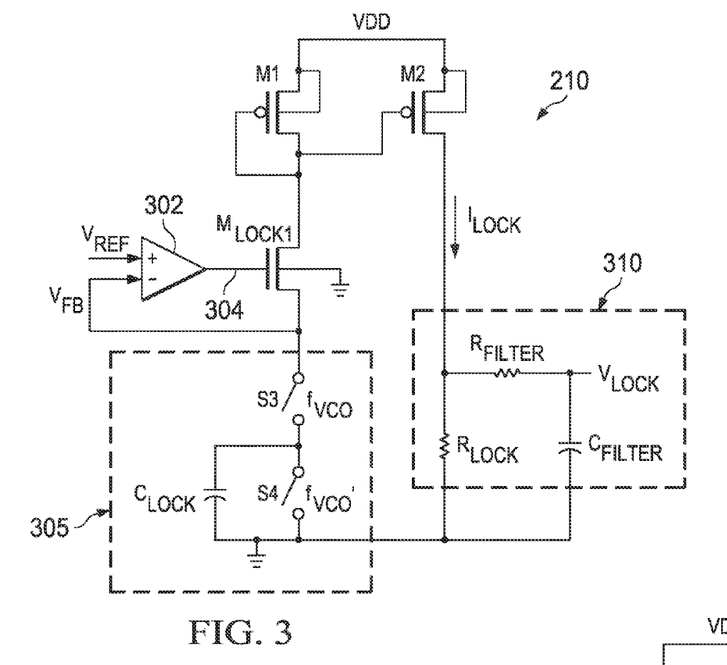
FIG. 3 illustrates an example embodiment of the switched capacitive circuit of FIG. 2A.

Referring now to FIG. 3, an example embodiment of the switched capacitive circuit 210 of FIG. 2A is shown in greater detail. The switched capacitive circuit 210 includes an operational amplifier 302 that receives reference voltage $V_{REF}$ at a first input and a feedback voltage $V_{FB}$ at a second input. In some embodiments, $V_{REF}$ may be generated using a bandgap circuit (not shown). The operational amplifier 302 produces an output signal 304 for driving the gate of transistor $M_{LOCK1}$, which is used to produce a lock current $I_{LOCK}$ across current mirroring transistors M1 and M2.

The switched capacitive circuit 210 also includes a switched capacitor portion 305 having switches S3 and S4 for selectively coupling a capacitor $C_{LOCK}$ to the feedback input of the operational amplifier 302. The VCO frequency $f_{VCO}$ controls switches S3 and S4 in alternating fashion, wherein switch S3 is closed responsive to $f_{VCO}$ and switch S4 is closed responsive to $f_{VCO}'$. When switch S3 is closed, capacitor $C_{LOCK}$ is coupled to the feedback input of the operational amplifier 302. When switch S4 is closed, capacitor $C_{LOCK}$ is shunted.

The switched capacitive circuit 210 also includes an output portion 310 that receives the current $I_{LOCK}$ from mirroring transistors M1 and M2, and produces a lock voltage $V_{LOCK}$. $V_{LOCK}$ is representative of the instant VCO frequency $f_{VCO}$, and is driven to $V_{REF}$ by the switched capacitive circuit 210, such that $V_{LOCK}=V_{REF}$ when the VCO frequency $f_{VCO}$ reaches a steady state ($f_{VCO}(\text{steady})=1/(C_{LOCK}*R_{LOCK})$), wherein the steady state of $f_{VCO}$ indicates achievement of coarse lock. The output portion 310 includes a resistor $R_{LOCK}$ and filtering circuitry: resistor $R_{FILTER}$ and capacitor $C_{FILTER}$, wherein the filtering circuitry is operable to generate $V_{LOCK}$ based on the average value of the voltage across resistor $R_{LOCK}$. Specifically, $V_{LOCK}=I_{LOCK}*R_{LOCK}=V_{REF}*f_{VCO}*C_{LOCK}*R_{LOCK}$.

When coarse lock is achieved, $f_{VCO}(\text{steady})=1/(C_{LOCK}*R_{LOCK})$ and $V_{LOCK}=V_{REF}$. Reference voltage $V_{REF}$ is used to control the switched capacitive circuit 210 such that $V_{FB}=V_{REF}$ and $V_{LOCK}=V_{REF}$ at the time coarse lock is achieved. As this occurs, control voltage $V_{CONT}$ is automatically driven towards a voltage for which the VCO frequency $f_{VCO}$ reaches the steady state ($f_{VCO}(\text{steady})=1/(R_{LOCK}*C_{LOCK})$). In other words, $V_{CONT}$ is automatically adjusted until $V_{LOCK}=V_{REF}$. It should be appreciated that for different operating conditions, the value of $V_{CONT}$ may vary, but the value of $f_{VCO}$ is maintained due to the negative feedback operation provided by the switched capacitive and secondary feedback circuits 210 and 220, as explained in greater detail below.

Figure 4:
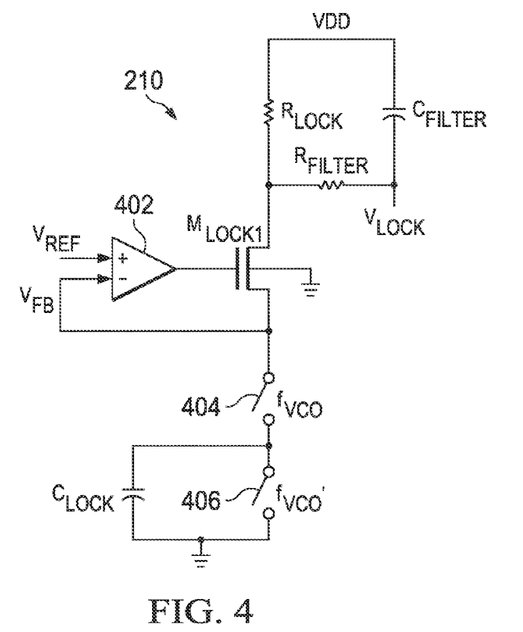
FIG. 4 illustrates an alternate embodiment of the switched capacitive circuit of FIG. 2A.

An alternate embodiment of the switched capacitive circuit 210 of FIG. 2A is shown in FIG. 4. The switched capacitive circuit 210 shown in FIG. 4 is similar to that described above with respect to FIG. 3, and includes an operational amplifier 402 receiving reference voltage $V_{REF}$ and feedback voltage $V_{FB}$, transistor $M_{LOCK1}$, filter circuitry $R_{FILTER}$ and $C_{FILTER}$, and resistor $R_{LOCK}$. The filtering circuitry is operable to generate $V_{LOCK}$ based on the average value of the voltage across resistor $R_{LOCK}$. Also shown is a switched capacitor portion wherein capacitor $C_{LOCK}$ is selectively coupled between the feedback input of the operational amplifier 402 and ground by switches 404 and 406, respectively. Switches 404 and 406 operate in alternating fashion wherein switch 404 is closed responsive to $f_{VCO}$ and switch 406 is closed responsive to $f_{VCO}'$. In some embodiments, the grounded connection of transistor $M_{LOCK1}$ illustrated in FIG. 4 may be alternatively connected to the source of $M_{LOCK1}$.

Figure 5:
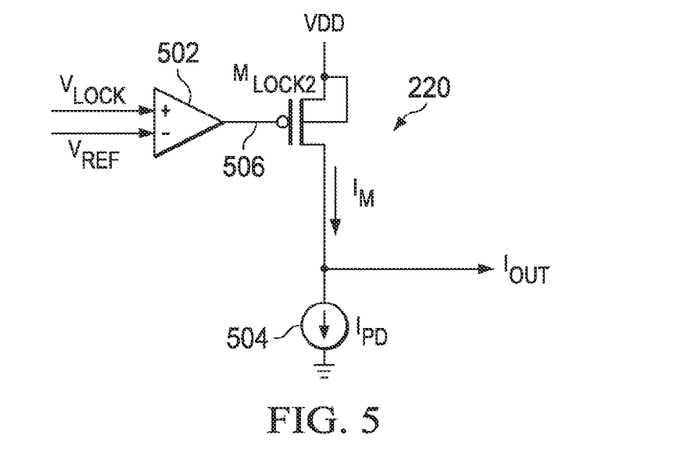
FIG. 5 illustrates an example embodiment of the secondary feedback circuit of FIG. 2A.

FIG. 5 illustrates an embodiment of the secondary feedback circuit 220 of FIG. 2A. The embodiment illustrated in FIG. 5 is typically used in embodiments in which the VCO control voltage $V_{CONT}$ is initialized to a voltage greater than zero. The secondary feedback circuit 220 receives reference voltage $V_{REF}$ and the switched capacitive circuit output voltage $V_{LOCK}$, and produces an output current $I_{OUT}$ for controlling $V_{CONT}$ in response to the on-the-fly $f_{VCO}$ measurements represented by the voltage $V_{LOCK}$. As shown in FIG. 5, the secondary feedback circuit 220 includes an operational amplifier 502, transistor $M_{LOCK2}$, and a current source 504. Voltages $V_{REF}$ and $V_{LOCK}$ are received at the operational amplifier 502, which produces an output signal 506 for driving the gate of transistor $M_{LOCK2}$. When $V_{LOCK}$ is less than $V_{REF}$, transistor $M_{LOCK2}$ is turned on and produces a current $I_M$ larger than the pull-down current $I_{PD}$ generated by the current source 504. Accordingly, the output current $I_{OUT}$ becomes a sourcing current that is used to charge capacitor $C_{DECAP}$, thereby increasing $V_{CONT}$. When $V_{LOCK}$ is greater than or equal to $V_{REF}$, transistor $M_{LOCK2}$ is turned off, and the output current $I_{OUT}$ is equal to the pull-down current $I_{PD}$. Accordingly, the output current $I_{OUT}$ becomes a sinking current that is used to discharge capacitor $C_{DECAP}$, thereby decreasing $V_{CONT}$.

Figure 6:
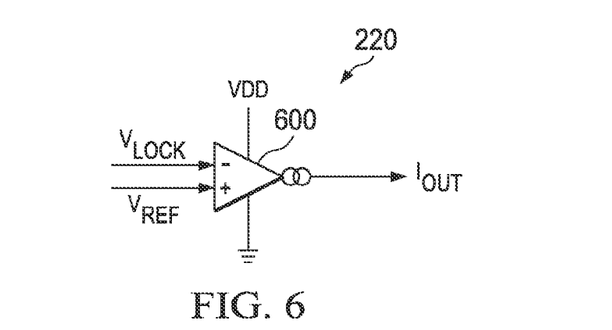
FIG. 6 illustrates an alternate embodiment of the secondary feedback circuit of FIG. 2A.

FIG. 6 illustrates an alternate embodiment of the secondary feedback circuit 220. The embodiment illustrated in FIG. 6 is similar to that shown and described above with respect to FIG. 5, except that the operational amplifier 502, transistor $M_{LOCK2}$ and current source 504 are replaced with a single OTA circuit 600 capable of sinking and sourcing currents. The secondary feedback circuit illustrated in FIG. 6 may provide increased stability when compared to other embodiments of the secondary feedback circuit. Additionally, in some embodiments, stability of the secondary feedback circuit 220 may be improved by ensuring that the loop bandwidth of the feedback circuit 220 is significantly lower than the VCO frequency $f_{VCO}$ (e.g., 10% $f_{VCO}$). Furthermore, in some embodiments, a switch can be used to short $R_{LOOP}$ during the coarse locking mode (i.e., when switch S1 is closed and switch S2 is open).

Figure 7:
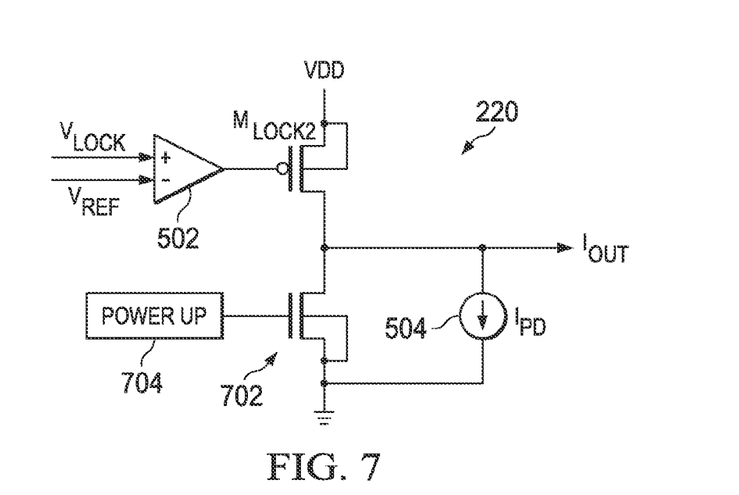
FIG. 7 illustrates another alternate embodiment of the secondary feedback circuit of FIG. 2A.

FIG. 7 illustrates yet another alternate embodiment of the secondary feedback circuit 220. The embodiment illustrated in FIG. 7 is typically used in embodiments in which the VCO control voltage $V_{CONT}$ is initialized to 0V. In the embodiment illustrated in FIG. 7, the secondary feedback circuit 220 shown in FIG. 5 is modified to include a pull-down NMOS transistor 702 coupled in parallel with the current source 504. The NMOS transistor 702 has a current capacity greater than that of transistor $M_{LOCK2}$. At start-up, the NMOS transistor 702 receives an initial voltage pulse from a power-up circuit 704 so that the NMOS transistor 702 is turned on and the output current $I_{OUT}$ generated at the moment by the NMOS transistor 702, is a sinking current that immediately discharges capacitor $C_{DECAP}$ such that $V_{CONT}$ is initialized to 0V. The NMOS transistor 702 is then switched off, and transistor $M_{LOCK2}$ begins to generate the output current $I_{OUT}$, which then becomes a sourcing current that is used to charge capacitor $C_{DECAP}$, thereby increasing $V_{CONT}$. In some embodiments, the VCO 106 may include a free-running frequency such that VCO 106 is active at the 0V initialization to allow $V_{LOCK}$, and thus, $V_{CONT}$ to be increased from the 0V initialization value. Upon initialization of the present embodiment, $V_{LOCK}$ is 0V, and $M_{LOCK2}$ slowly increases $V_{CONT}$ until coarse lock is achieved. Once the lock detection circuit 108 detects coarse lock of the PLL circuit 100, the lock signal 109 triggers the switching of the first and second switches S1 and S2 so that the secondary feedback circuit 220 and switched capacitive circuit 210 are disconnected from the VCO 106, and the charge pump 104 is connected to the VCO 106 for fine lock operation. At this point, the reference frequency signal $f_{REF}$ is used to control the charge pump 104, as explained above, to adjust the VCO control voltage $V_{CONT}$ until fine lock is achieved.

Referring again to FIGS. 2A, 3 and 5, the secondary feedback circuit 220 and switched capacitive circuit 210 are selectively coupled to the VCO 106 via switch S1. At start-up, and in the first mode, the first switch S1 is closed and the second switch S2 is opened. At this time, $V_{CONT}$ is initialized to a particular voltage. In some embodiments, $V_{CONT}$ is initialized to 0V, whereas, in other embodiments, $V_{CONT}$ is initialized to a voltage greater than zero. In embodiments in which $V_{CONT}$ is initialized to a voltage greater than zero, the VCO frequency $f_{VCO}$ starts at 0 Hz, so $V_{LOCK}$ is initially set to 0V. In accordance with the embodiments illustrated in FIGS. 5 and 6, $V_{CONT}$ is initialized to VDD. At this point, the VCO frequency $f_{VCO}$ is relatively large, and $V_{LOCK}$ quickly goes to VDD, which is larger than $V_{REF}$, and $V_{CONT}$ begins to slowly decrease. As $V_{CONT}$ decreases, $f_{VCO}$ also decreases, and $V_{LOCK}$ decreases until it approaches $V_{REF}$, at which point $M_{LOCK2}$ begins regulating $V_{CONT}$. At this point, coarse lock is achieved as $f_{VCO}(\text{steady})=1/(C_{LOCK}*R_{LOCK})$ and $V_{LOCK}=V_{REF}$. Once the lock detection circuit 108 detects coarse lock of the PLL circuit 100, the lock signal 109 triggers the switching of the first and second switches S1 and S2 so that the secondary feedback circuit 220 and switched capacitive circuit 210 are disconnected from the VCO 106, and the charge pump 104 is connected to the VCO 106 for fine lock operation in the second mode. At this point, the reference frequency signal $f_{REF}$ is used to control the charge pump 104 to adjust the VCO control voltage $V_{CONT}$ until fine lock is achieved.

Figure 8:
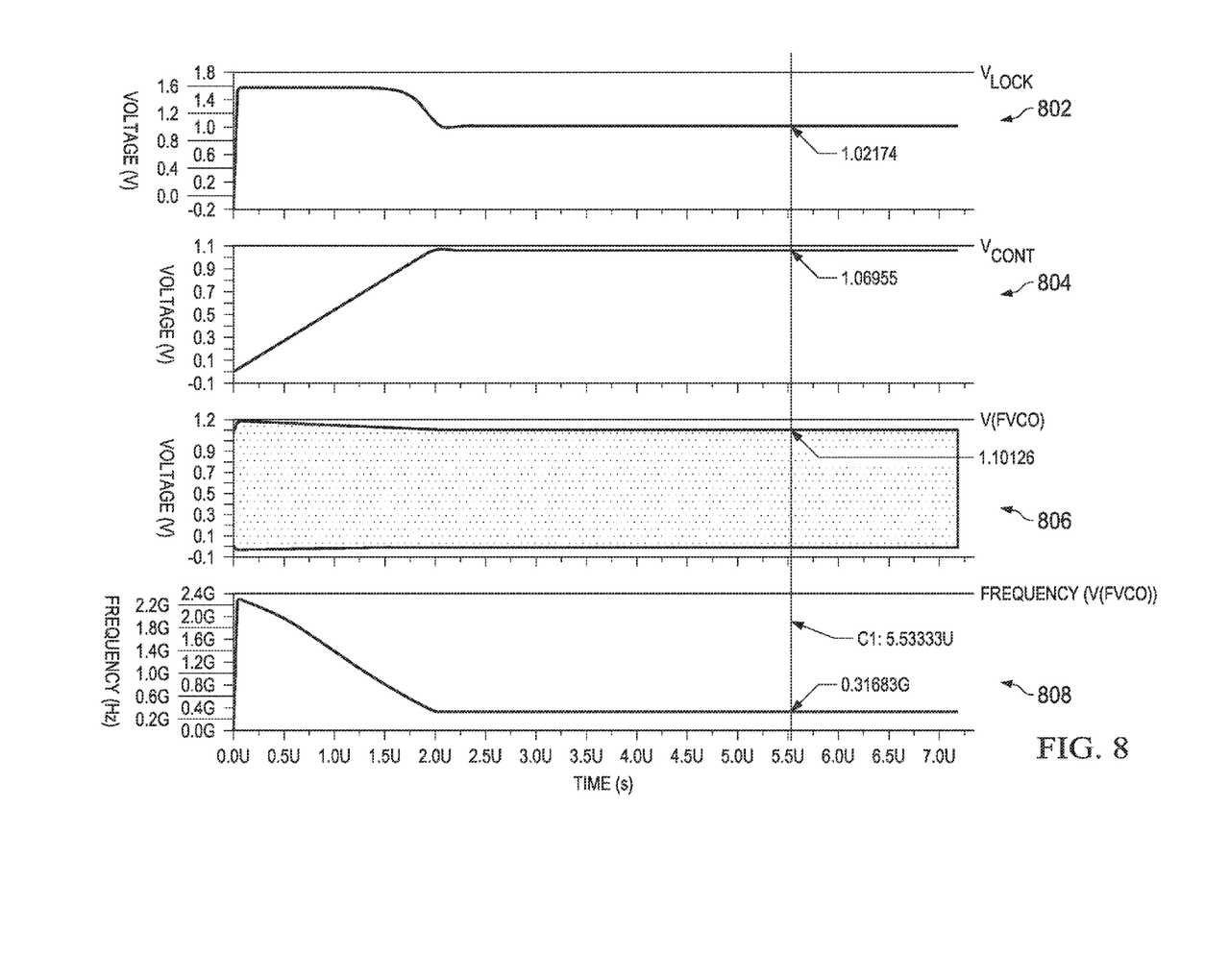
FIG. 8 illustrates various waveforms corresponding to the operation of an example embodiment of the modified PLL circuit.

FIG. 8 illustrates various example waveforms for an example embodiment of the modified PLL circuit 200 in which the target $f_{VCO}$ is approximately 300 MHz and VCO 106 is initialized at VDD. The waveforms include the $V_{LOCK}$ waveform 802, $V_{CONT}$ waveform 804, VCO waveform 806 and $f_{VCO}$ waveform 808. The embodiment illustrated in FIG. 8 corresponds to a PLL that typically achieves lock in approximately 5 ms. However, by incorporating the switched capacitive circuitry and secondary feedback circuitry, the PLL is able to achieve coarse lock in approximately 10 μs.

Figure 9:
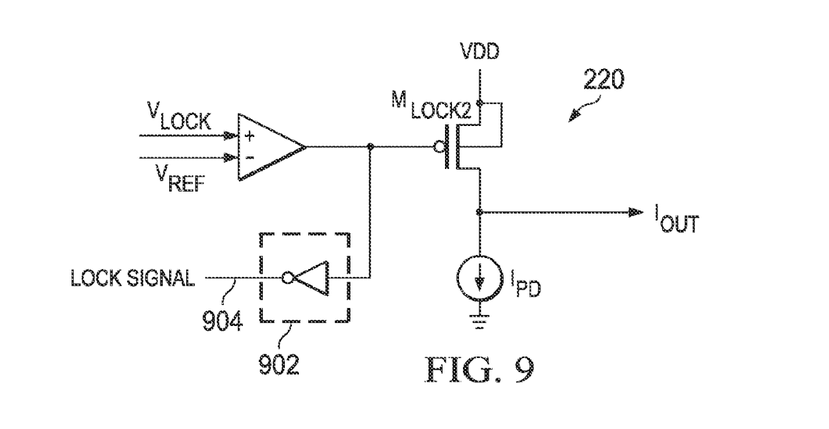
FIG. 9 illustrates an embodiment of the secondary feedback circuit wherein the PLL circuit is modified to act as a lock detection circuit.

In some embodiments, the secondary feedback circuit 220 may also act as a lock detection circuit. FIG. 9 illustrates an example of such an embodiment, wherein the secondary feedback circuit 220 (similar to that shown in FIG. 5) is modified to include lock detection circuitry 902 operable to produce a lock detection signal 904 when $V_{Lock}=V_{REF}$. The lock detection circuitry 902 may obviate the need for the lock detection circuit 108. Therefore, in some embodiments, the lock detection circuit 108 may be replaced with a power-on/reset circuit (not shown) for controlling switching operations and performing other such functionality. In embodiments similar to that shown in FIG. 6 wherein the operational amplifier, transistor $M_{LOCK2}$ and current source are replaced with a single OTA circuit, resistor $R_{LOOP}$ may be shorted when switch S1 is closed to make the lock detection signal 904 even more precise.

Figure 10:
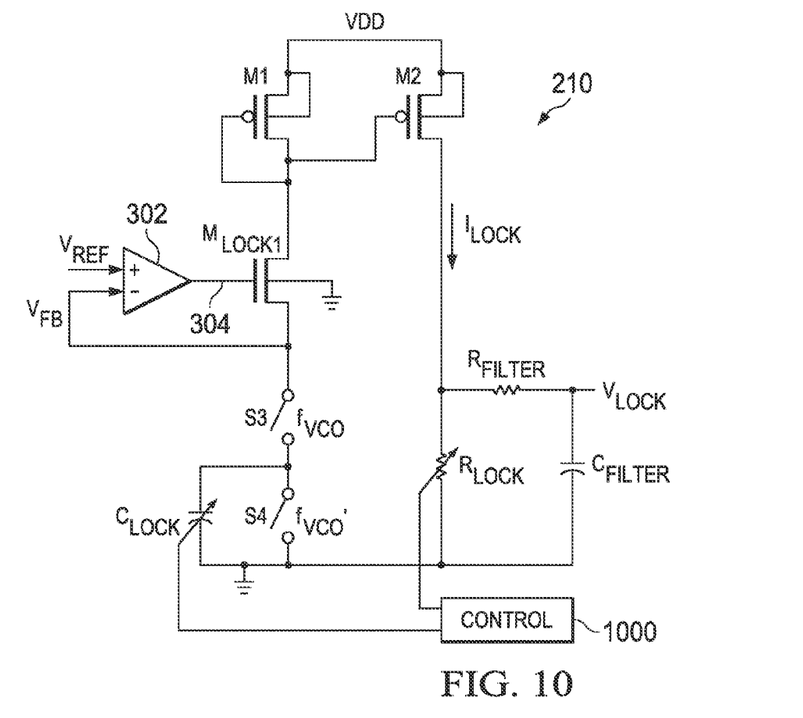
FIG. 10 illustrates an embodiment of the switched capacitive circuit capable of accommodating a variable VCO frequency.

In most embodiments, it is assumed that there is a single VCO frequency $f_{VCO}$ to which $R_{LOCK}$ and $C_{LOCK}$ can be tuned. For example, for $f_{VCO}(\text{steady})=316.83$ MHz, $C_{LOCK}=200$ fF and $R_{LOCK}=15.8$ Kohms. However, in some embodiments, a variable VCO frequency $f_{VCO}$ may be achieved by providing a variable resistance $R_{LOCK}$ and variable capacitance $C_{LOCK}$ as shown in FIG. 10. In such an embodiment, control circuitry 1000 may be provided to control the respective resistive and capacitive values of $R_{LOCK}$ and $C_{LOCK}$ to correspond to a varying VCO frequency $f_{VCO}$.

In some embodiments, the modified PLL circuit 200 may be calibrated during start-up/initialization using an external VCO clock or an external bias current to remove any RC variation effect resulting from low-pass filter components ($R_{LOOP}$, $C_{LOOP}$ and $C_{DECAP}$). Once the circuit 200 has been calibrated, in some embodiments, the circuit 200 may be designed to have +/−2% variation in the VCO frequency $f_{VCO}$.

In some embodiments, the switched capacitive circuit 210 and secondary feedback circuit 220 may be controlled with a reference current $I_{REF}$ instead of the reference voltage $V_{REF}$. In such embodiments, the reference current $I_{REF}$ may be provided by a bandgap or constant current circuit (not shown), and the VCO frequency steady state may be represented as $f_{VCO}(\text{steady})=I_{REF}/(C_{LOCK}*V_{REF})$. Thus, when coarse lock is achieved, $f_{VCO}(\text{steady})=I_{REF}/(C_{LOCK}*V_{REF})$ and $V_{LOCK}=V_{REF}$.

Figure 11A:
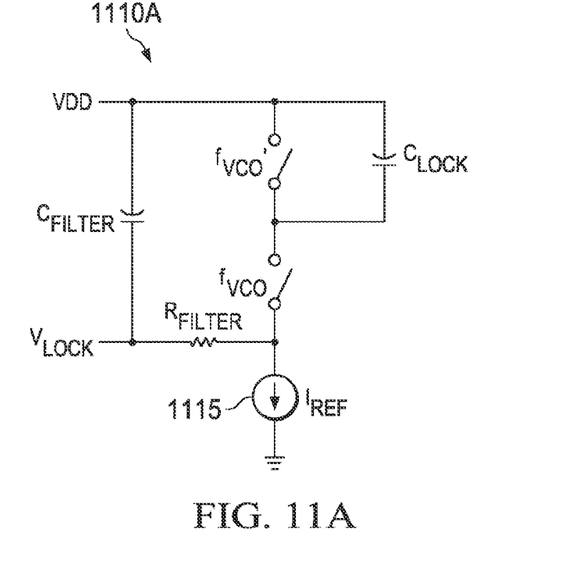
FIGS. 11A and 11B illustrate example embodiments of switched capacitive circuits controlled using a reference current.
Figure 11B:
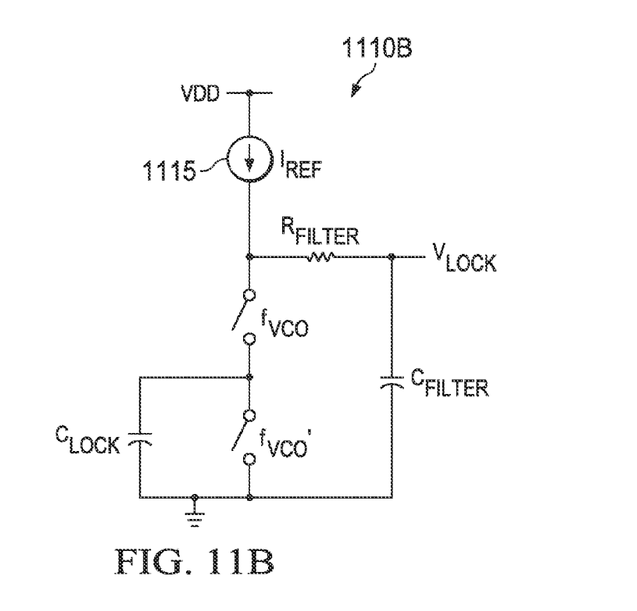

FIGS. 11A and 11B illustrate example embodiments of switched capacitive circuits 1110A/1110B controlled using the reference current $I_{REF}$. The switched capacitive circuits 1110A/1110B illustrated in FIGS. 11A and 11B operate similar to those illustrated in FIGS. 3 and 4 except that the transistor $M_{LOCK1}$, operational amplifier 302/402, and current mirroring transistors M1 and M2 (of FIG. 3) are replaced with a current source 1115 operable to generate the reference current $I_{REF}$. Reference current $I_{REF}$ is used to control the switched capacitive circuits 1110A/110B such that $V_{LOCK}=V_{REF}$ at the time coarse lock is achieved. When this occurs, control voltage $V_{CONT}$ is automatically driven towards a voltage for which the VCO frequency $f_{VCO}$ reaches the steady state ($f_{VCO}$(steady)=$I_{REF}/(C_{LOCK}*V_{REF})$). In other words, $V_{CONT}$ is automatically adjusted until $V_{LOCK}=V_{REF}$.

Figure 12A:
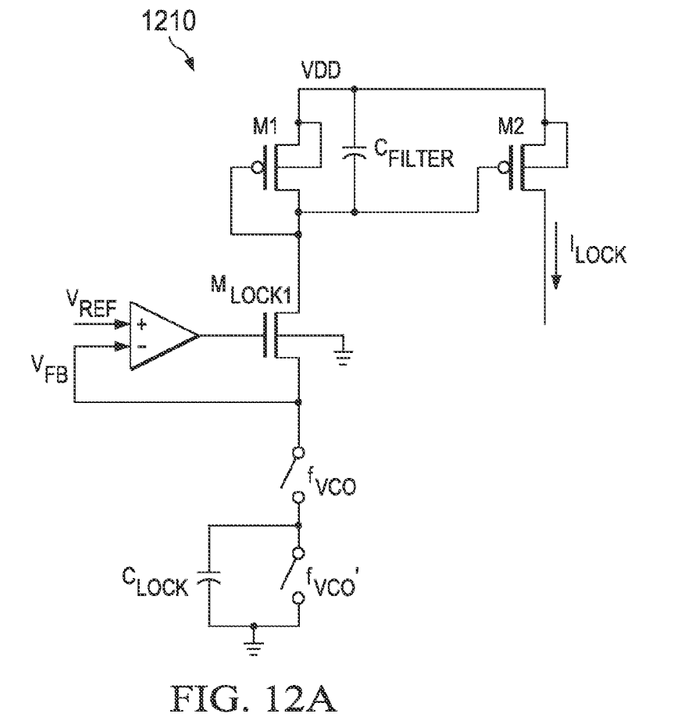
FIGS. 12A and 12B illustrate example embodiments of a switched capacitive circuit and a secondary feedback circuit, respectively, for use in such an embodiment wherein a lock current is used to indicate the instant VCO frequency.
Figure 12B:
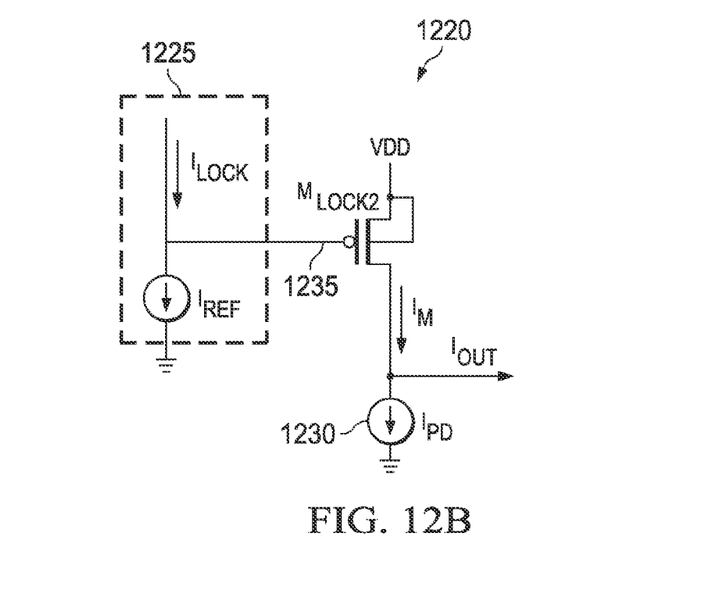

In some embodiments, the lock current $I_{LOCK}$ may be used to indicate the instant VCO frequency $f_{VCO}$. In such embodiments, the lock current $I_{LOCK}$ may be driven to the value of a reference current $I_{REF}$ such that $I_{LOCK}=I_{REF}$ when the VCO frequency $f_{VCO}$ reaches a steady state ($f_{VCO}$(steady)=$I_{REF}/(C_{LOCK}*V_{REF})$), wherein the steady state of $f_{VCO}$ indicates achievement of coarse lock. As this occurs, control voltage $V_{CONT}$ is automatically driven towards a voltage for which the VCO frequency $f_{VCO}$ reaches the steady state ($f_{VCO}$(steady)=$I_{REF}/(C_{LOCK}*V_{REF})$). In other words, $V_{CONT}$ is automatically adjusted until $I_{LOCK}=I_{REF}$. FIGS. 12A and 12B illustrate example embodiments of a switched capacitive circuit 1210 and a secondary feedback circuit 1220, respectively, for use in such an embodiment wherein the lock current $I_{LOCK}$ is used to indicate the instant VCO frequency $f_{VCO}$.

In the embodiment illustrated in FIG. 12A, the switched capacitive circuit 1210 operates similar to the switched capacitive circuit illustrated in FIG. 3 to produce the locking current $I_{LOCK}$ as its output, wherein the locking current $I_{LOCK}$ is representative of the instant VCO frequency $f_{VCO}$. The corresponding embodiment of the secondary feedback circuit 1220 illustrated in FIG. 12B receives the lock current $I_{LOCK}$ and the reference current $I_{REF}$, and produces output current $I_{OUT}$ for controlling $V_{CONT}$ in response to the on-the-fly $f_{VCO}$ measurements represented by the lock current $I_{LOCK}$. The secondary feedback circuit 1220 operates similar to the secondary feedback circuit illustrated in FIG. 5.

As shown in FIG. 12B, the secondary feedback circuit 1220 includes current comparison circuitry 1225, transistor $M_{LOCK2}$, and current source 1230. The current comparison circuitry 1225 compares the lock current $I_{LOCK}$ to the reference current $I_{REF}$ to produce a signal 1235 for driving the gate of transistor $M_{LOCK2}$. When the lock current $I_{LOCK}$ is less than the reference current $I_{REF}$, transistor $M_{LOCK2}$ is turned on and produces a current $I_M$ larger than the pull-down current $I_{PD}$ generated by the current source 1230. Accordingly, the output current $I_{OUT}$ becomes a sourcing current that is used to charge capacitor $C_{DECAP}$, thereby increasing $V_{CONT}$. When $I_{LOCK}$ is greater than or equal to $I_{REF}$, transistor $M_{LOCK2}$ is turned off, and the output current $I_{OUT}$ is equal to the pull-down current $I_{PD}$. Accordingly, the output current $I_{OUT}$ becomes a sinking current that is used to discharge capacitor $C_{DECAP}$, thereby decreasing $V_{CONT}$.

Various adaptations may be made to the circuitry provided herein without departing from the scope of the present disclosure. For example, in some embodiments, the VCO 106 may include frequency-limiting circuitry to prevent $f_{VCO}$ from rising above a certain value. Furthermore, it should be appreciated by those of ordinary skill in the art that the polarity of the operational amplifier used in various embodiments of the secondary feedback circuit 220 may be switched depending upon the embodiment of the switched capacitive circuit being used. For example, if the alternate embodiment of the switched capacitive circuit 210 illustrated in FIG. 4 is used, then the polarity of the operational amplifier 502 shown in FIG. 5 may be switched such that $V_{REF}$ is coupled to the positive input terminal, and $V_{LOCK}$ is coupled to the negative input terminal Additionally, if the alternate embodiment of the switched capacitive circuit 210 illustrated in FIG. 4 is used, then the polarity of the single OTA 600 shown in FIG. 6 may be switched such that $V_{REF}$ is coupled to the negative input terminal, and $V_{LOCK}$ is coupled to the positive input terminal.

The foregoing description has provided by way of exemplary and non-limiting examples a full and informative description of one or more exemplary embodiments of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

What is claimed is:

1. A phase lock loop circuit, comprising:
   a voltage controlled oscillator configured to generate an output frequency signal;
   a frequency divider configured to divide the output frequency signal and generate a feedback frequency signal;
   a first circuit configured to adjust a control voltage of the voltage controlled oscillator at a rate set by a reference frequency signal;
   a second circuit configured to adjust the control voltage of the voltage controlled oscillator at a rate set by the output frequency signal;
   a lock circuit configured to detect a frequency lock condition; and
   a switching circuit configured to couple the first circuit to the voltage controlled oscillator when the frequency lock condition is detected by the lock circuit and couple the second circuit to the voltage controlled oscillator when the frequency lock condition is not detected by the lock circuit;
   wherein the second circuit comprises:
      a switched capacitive circuit configured to switch a capacitor in response to the output frequency signal and generate a lock signal in response thereto; and
      a second charge control circuit configured to adjust the control voltage of the voltage controlled oscillator in response to the lock signal.

2. The phase lock loop circuit as set forth in claim 1, wherein the first circuit comprises:
   a comparator configured to compare a phase of the reference frequency signal to a phase of the feedback frequency signal and generate a phase error signal; and
   a first charge control circuit configured to adjust the control voltage of the voltage controlled oscillator in response to the phase error signal.

3. The phase lock loop circuit as set forth in claim 1, wherein the lock signal is a lock voltage and the control voltage of the voltage controlled oscillator is adjusted in response to the lock voltage.

4. The phase lock loop circuit as set forth in claim 3, wherein the charging circuit comprises an operational transconductance amplifier circuit.

5. A phase lock loop circuit, comprising:
   a voltage controlled oscillator configured to generate an output frequency signal;

a frequency divider configured to divide the output frequency signal and generate a feedback frequency signal;
a first circuit configured to adjust a control voltage of the voltage controlled oscillator at a rate set by a reference frequency signal;
a second circuit configured to adjust the control voltage of the voltage controlled oscillator at a rate set by the output frequency signal;
a lock circuit configured to detect a frequency lock condition; and
a switching circuit configured to couple the first circuit to the voltage controlled oscillator when the frequency lock condition is detected by the lock circuit and couple the second circuit to the voltage controlled oscillator when the frequency lock condition is not detected by the lock circuit;
wherein the second circuit comprises:
a frequency-to-voltage converter circuit configured to convert a frequency of the output frequency signal to a lock signal;
a comparator configured to compare the lock signal to a reference signal and generate a charge control signal; and
a charging circuit configured to adjust the control voltage of the voltage controlled oscillator by performing at least one of sourcing or sinking current in response to the charge control signal.

6. The phase lock loop circuit as set forth in claim 5, wherein the frequency-to-voltage converter circuit comprises a switched capacitive circuit configured to switch a capacitor in response to the output frequency signal and generate the lock signal in response thereto.

7. The phase lock loop circuit as set forth in claim 5, wherein the charging circuit comprises:
a transistor operable to generate a sourcing current in response to the charge control signal; and
a current source operable to generate a sinking current.

8. The phase lock loop circuit as set forth in claim 7, wherein the charging circuit further comprises a second transistor operable to generate a sinking current.

9. The phase lock loop circuit as set forth in claim 1, wherein the lock signal is a lock current and the control voltage of the voltage controlled oscillator is adjusted in response to the lock current.

10. The phase lock loop circuit as set forth in claim 1, wherein the second circuit comprises:
a frequency-to-current converter circuit configured to convert a frequency of the output frequency signal to a lock signal;
a comparator configured to compare the lock signal to a reference signal and generate a charge control signal; and
a charging circuit configured to adjust the control voltage of the voltage controlled oscillator by performing at least one of sourcing or sinking current in response to the charge control signal.

11. The phase lock loop circuit as set forth in claim 10, wherein the frequency-to-current converter circuit comprises a switched capacitive circuit configured to switch a capacitor in response to the output frequency signal and generate the lock signal in response thereto.

12. A phase lock loop circuit, comprising:
a voltage controlled oscillator circuit operable to receive a control voltage and generate an output frequency signal responsive to the control voltage;
a switched capacitive circuit operable to receive the output frequency signal and to produce a first signal indicative of the output frequency signal;
a first charge control circuit operable to compare the first signal to a reference signal, and to produce a first current for adjusting the control voltage to achieve a first lock condition;
a second charge control circuit operable to generate a second current for adjusting the control voltage to achieve a second lock condition; and
control circuitry operable to couple the first charge control circuit to the voltage controlled oscillator circuit until the first lock condition is achieved, and operable, after the first lock condition is achieved, to couple the second charge control circuit to the voltage controlled oscillator circuit until the second lock condition is achieved.

13. The phase lock loop circuit as set forth in claim 12, wherein the switched capacitive circuit is operable to switch a capacitor in response to the output frequency signal to generate the first signal.

14. The phase lock loop circuit as set forth in claim 12, wherein the first signal is a first voltage indicative of the output frequency signal, and the reference signal is a reference voltage.

15. The phase lock loop circuit as set forth in claim 14, wherein the switched capacitive circuit comprises a frequency-to-voltage converter circuit configured to convert a frequency of the output frequency signal to the first voltage indicative of the output frequency signal.

16. The phase lock loop circuit as set forth in claim 12, wherein the first signal is a first current indicative of the output frequency signal, and the reference signal is a reference current.

17. The phase lock loop circuit as set forth in claim 16, wherein the switched capacitive circuit comprises a frequency-to-current converter circuit configured to convert a frequency of the output frequency signal to the first current indicative of the output frequency signal.

18. The phase lock loop circuit as set forth in claim 12, wherein the first charge control circuit is operable to adjust the control voltage at a rate set by the output frequency signal.

19. The phase lock loop circuit as set forth in claim 12, wherein the second charge control circuit is operable to adjust the control voltage at a rate set by a reference frequency signal.

20. The phase lock loop circuit as set forth in claim 12, wherein the second charge control circuit comprises:
a comparator configured to compare a phase of the reference frequency signal to a phase of a feedback frequency signal and generate a phase error signal; and
charge circuitry configured to adjust the control voltage of the voltage controlled oscillator in response to the phase error signal.

21. The phase lock loop circuit as set forth in claim 20, wherein the phase lock loop circuit further comprises a frequency divider configured to divide the output frequency signal and generate the feedback frequency signal.

22. The phase lock loop circuit as set forth in claim 12, wherein the switched capacitive circuit and first charge control circuit are operable to set the control voltage to a voltage greater than zero volts at start-up of the phase lock loop circuit.

23. A method for achieving a lock condition in a phase lock loop circuit, the method comprising:
coupling feedback circuitry to an oscillator circuit;
providing a control voltage for controlling the oscillator circuit at a first frequency;

producing, via a switched capacitive circuit, a lock signal indicative of the first frequency;

generating, in response to the lock signal, a first current for adjusting the control voltage at a rate set by the first frequency to achieve a first lock condition;

detecting the first lock condition;

coupling current-generating circuitry to the oscillator circuit; and generating, via the current-generating circuitry, a second current for adjusting the control voltage at a rate set by a reference frequency signal to achieve a second lock condition.

24. The method as set forth in claim 23, wherein generating, in response to the lock signal, the first current for adjusting the control voltage at the rate set by the first frequency to achieve the first lock condition comprises:

comparing the lock signal to a reference signal; and generating the first current in response to the comparison.

25. The method as set forth in claim 23, wherein producing, via the switched capacitive circuit, the lock signal indicative of the first frequency comprises:

converting the first frequency to the lock signal.

26. The method as set forth in claim 23, wherein producing, via the switched capacitive circuit, the lock signal indicative of the first frequency comprises:

switching a capacitor in response to the first frequency to generate the lock signal.

27. The method as set forth in claim 23, wherein detecting the first lock condition comprises comparing a reference frequency signal to a signal representative of the first frequency.

28. The method as set forth in claim 23, wherein generating, via the current-generating circuitry, the second current for adjusting the control voltage at the rate set by the reference frequency signal to achieve the second lock condition comprises:

comparing a phase of the reference frequency signal to a phase of a feedback frequency signal;

generating a phase error signal; and adjusting the control voltage of the oscillator circuit in response to the phase error signal.

29. The method as set forth in claim 23, wherein the lock signal comprises a lock voltage.

30. The method as set forth in claim 23, wherein the lock signal comprises a lock current.

31. A method for achieving a lock condition in a phase lock loop circuit, the method comprising:

providing a control voltage for controlling a voltage controlled oscillator circuit to generate an output frequency signal;

detecting a frequency lock condition;

modulating the control voltage as a function of a reference frequency signal when the frequency lock condition is detected; and modulating the control voltage as a function of the output frequency signal when the frequency lock condition is not detected;

wherein modulating the control voltage as a function of the output frequency signal comprises:

switching a capacitor in response to the output frequency signal to generate a lock signal; and adjusting the control voltage of the voltage controlled oscillator circuit in response to the lock signal.

32. The method as set forth in claim 31, wherein modulating the control voltage as a function of the reference frequency signal comprises:

dividing the output frequency signal to generate a feedback frequency signal;

comparing the feedback frequency signal to the reference frequency signal to generate an error signal; and modulating the control voltage in response to the error signal.

33. The method as set forth in claim 31, wherein switching the capacitor in response to the output frequency signal generates generate a lock voltage and the control voltage of the voltage controlled oscillator circuit is adjusted in response to the lock voltage.

34. The method as set forth in claim 31, wherein switching the capacitor in response to the output frequency signal generates a lock current and the control voltage of the voltage controlled oscillator circuit is adjusted in response to the lock current.

35. The method as set forth in claim 31, wherein the lock signal is lock current and the reference signal is a reference current.

36. A method for achieving a lock condition in a phase lock loop circuit, the method comprising:

providing a control voltage for controlling a voltage controlled oscillator circuit to generate an output frequency signal;

detecting a frequency lock condition;

modulating the control voltage as a function of a reference frequency signal when the frequency lock condition is detected; and modulating the control voltage as a function of the output frequency signal when the frequency lock condition is not detected;

wherein modulating the control voltage as a function of the output frequency signal comprises:

converting a frequency of the output frequency signal to a lock signal;

comparing the lock signal to a reference signal;

generating a charge control signal; and adjusting the control voltage of the voltage controlled oscillator by performing at least one of sourcing or sinking current in response to the charge control signal.

* * * * *